(12) United States Patent
Wu et al.

(10) Patent No.: US 9,716,220 B2
(45) Date of Patent: Jul. 25, 2017

(54) GRAPHENE-BASED TERAHERTZ DEVICES

(71) Applicant: National University of Singapore, Singapore (SG)

(72) Inventors: Yang Wu, Singapore (SG); Hyunsoo Yang, Singapore (SG); Xuepeng Qiu, Singapore (SG)

(73) Assignee: National University of Singapore, Singapore (SG)

( * ) Notice: Subject to any disclaimer, the term of this patent is extended or adjusted under 35 U.S.C. 154(b) by 0 days.

(21) Appl. No.: 14/912,249

(22) PCT Filed: Aug. 21, 2014

(86) PCT No.: PCT/SG2014/000394
§ 371 (c)(1),
(2) Date: Feb. 16, 2016

(87) PCT Pub. No.: WO2015/026298
PCT Pub. Date: Feb. 26, 2015

(65) Prior Publication Data
US 2016/0202505 A1    Jul. 14, 2016

Related U.S. Application Data

(60) Provisional application No. 61/868,330, filed on Aug. 21, 2013.

(51) Int. Cl.
*H01L 41/02*    (2006.01)
*G02F 1/1341*    (2006.01)
(Continued)

(52) U.S. Cl.
CPC .......... *H01L 41/107* (2013.01); *G02F 1/0316* (2013.01); *G02F 1/05* (2013.01);
(Continued)

(58) Field of Classification Search
CPC ..... H01L 41/107; G02F 1/061; G02F 1/0316; G02F 1/1341; G02F 1/134309;
(Continued)

(56) References Cited

U.S. PATENT DOCUMENTS 9,184,553 B2 * 11/2015 Ozyilmaz .......... H01S 3/06791
2007/0188668 A1   8/2007 Pan et al.
(Continued)

FOREIGN PATENT DOCUMENTS

CN    102437207    5/2012
EP    2602821    6/2013

OTHER PUBLICATIONS

Carrasco et al "Tunable Graphene Reflective Cells for THz Reflectarrays and Generalized Law of Reflection" Applied Physics Letters vol. 102, 2013.

*Primary Examiner* — Shean C Wu
(74) *Attorney, Agent, or Firm* — Cesari and McKenna, LLP

(57) ABSTRACT

Disclosed is a graphene-based terahertz device that includes a top graphene layer, a bottom graphene layer, and a middle layer disposed between the top graphene layer and the bottom graphene layer. The middle layer is a liquid crystal layer, a piezocrystal layer, an ionic liquid layer, or an ion gel layer. Also disclosed are methods of preparing different embodiments of the above-described graphene-based terahertz device.

27 Claims, 1 Drawing Sheet

(51) Int. Cl.
*G02F 1/1343* (2006.01)
*G02F 1/1345* (2006.01)
*H01L 41/107* (2006.01)
*G02F 1/061* (2006.01)
*G02F 1/03* (2006.01)
*G02F 1/05* (2006.01)
*G02F 1/355* (2006.01)

(52) U.S. Cl.
CPC ............ *G02F 1/061* (2013.01); *G02F 1/1341* (2013.01); *G02F 1/1345* (2013.01); *G02F 1/13439* (2013.01); *G02F 1/134309* (2013.01); *G02F 1/3551* (2013.01); *G02F 2202/022* (2013.01); *G02F 2203/13* (2013.01); *G02F 2203/50* (2013.01)

(58) Field of Classification Search
CPC ............... G02F 1/13439; G02F 1/1345; G02F 1/13551; G02F 2002/022; G02F 2203/13; G02F 2203/50
See application file for complete search history.

(56) References Cited

U.S. PATENT DOCUMENTS

| | | |
|---|---|---|
| 2010/0090759 A1 | 4/2010 | Shin et al. |
| 2012/0146743 A1 | 6/2012 | Ermolov |
| 2013/0127299 A1 | 5/2013 | Kim et al. |
| 2013/0342279 A1 | 12/2013 | Sensale-Rodriguez et al. |

\* cited by examiner

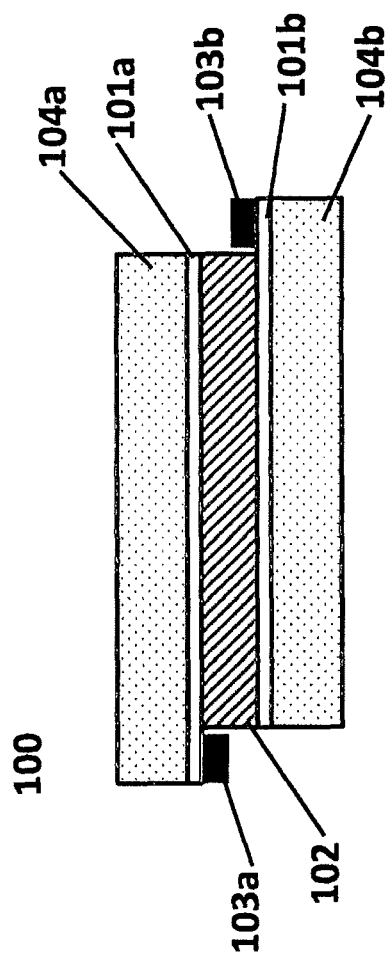

GRAPHENE-BASED TERAHERTZ DEVICES

CROSS REFERENCE TO RELATED APPLICATIONS

This application is the National Stage of International Application No. PCT/SG2014/000394, filed on Aug. 21, 2014, which claims the benefit of U.S. Provisional Application No. 61/868,330, filed on Aug. 21, 2013. The contents of both applications are hereby incorporated by reference in their entirety.

BACKGROUND OF THE INVENTION

Electromagnetic waves cover a spectrum from X-ray to radio frequencies. Among the spectra, the terahertz ("THz") waves, ranging from 0.1 THz (1012 Hz) to 30 THz, have been a focus of intense research in the last three decades for many promising applications, e.g., spectroscopy, safety surveillance, cancer diagnosis, imaging, and communication.

However, THz applications are limited due to a lack of high performance optical components that include a THz source, a THz detector, a phase shifter, and a modulator. In particular, the phase shifter, used to manipulate degrees of the phase of THz waves, and the modulator, used to change the amplitude of THz waves, are critical to THz applications.

Currently, the THz phase shifter mostly relies on electrically or magnetically controlled devices, either of which presents a major limitation. Namely, a high voltage, i.e., higher than 100 V, is required for an electrically controlled phase shifter and a magnetic field-based phase shifter is difficult for integration due to its bulky magnet(s).

Turning to the THz modulator, it typically suffers from a high insertion loss, i.e., a decrease in the intensity of THz signals. A vanadium oxide based THz modulator, which shows a low insertion loss, needs to be operated at a high temperature.

There is a need to develop a high-performance THz phase shifter and THz modulator for use THz in commercial applications.

SUMMARY OF THE INVENTION

This invention provides a graphene-based THz device that can operate at an unexpectedly low DC voltage when used as a THz phase shifter, and show an unexpectedly low insertion loss when used as a THz modulator.

One aspect of this invention relates to a graphene-based THz device that includes a top graphene layer, a bottom graphene layer, and a middle layer disposed between the top graphene layer and the bottom graphene layer. The middle layer is a liquid crystal layer, a piezocrystal layer, an ionic liquid layer, or an ion gel layer.

The top graphene layer and the bottom graphene layer are both formed of 1 to 10 (preferably, 1 to 4) graphenes in either oxidized or unoxidized form. They have a first electrode and a second electrode deposited respectively on one edge of the top graphene layer and one edge of the bottom graphene layer. The first electrode and the second electrode can be vertically misaligned to prevent short circuit through the middle layer.

The first electrode and the second electrode can be, independently, made of Ti, Au, Cr, Cu, or a combination thereof. It is preferred that the first electrode and the second electrode be both made of a combination of Cr and Au.

The top surface of the top graphene layer and the bottom surface of the bottom graphene layer are each covered by a layer of dielectric material.

Examples of the dielectric material include, but are not limited to, glass, silicon, magnesia, sapphire, and polymer.

In one embodiment, a graphene-based THz device of this invention includes a liquid crystal layer or a piezocrystal layer (as the middle layer) disposed between the top graphene layer and the bottom graphene layer. The liquid crystal layer or the piezocrystal layer has a thickness of 1 to 1000 μm (preferably, 5-100 μm, and, more preferably, 10-50 μm). The liquid crystal layer can be made of is 4'-n-pentyl-4-cyanobiphenyl ("5CB"). This embodiment can be used as a THz phase shifter. It can also be used as a THz mirror or a THz beam splitter.

In another embodiment, a graphene-based THz device of this invention includes an ionic liquid layer or an ion gel layer (as the middle layer) disposed between the top graphene layer and the bottom graphene layer. The ionic liquid layer or the ion gel layer has a thickness of 1 to 1000 μm (preferably, 5-100 μm, and, more preferably, 10-50 μm). This embodiment can be used as a THz modulator.

When the THz modulator of this invention includes an ionic liquid layer disposed between the top graphene layer and the bottom graphene layer, the ionic liquid layer can be made of 1-ethyl-3-methylimidazolium bis(tri-fluoromethylsulfonyl)imide ("[EMIM][TFSI]").

Another aspect of this invention relates to a method of preparing the above-described graphene-based THz device. The method includes the following steps: (i) providing a first layer of dielectric material; (ii) providing a first graphene layer that is formed of 1 to 10 graphenes on one surface of the first layer of dielectric material to form a top combined layer; (iii) depositing a first electrode on one edge of the first graphene layer; (iv) providing a second layer of dielectric material; (v) providing a second graphene layer that is formed of 1 to 10 graphenes on one surface of the second layer of dielectric material to form a bottom combined layer; (vi) depositing a second electrode on one edge of the second graphene layer; (vii) placing the top combined layer on the bottom combined layer such that they are separate by one or more spacers that have a height of 1 to 1000 μm leaving a space between the top combined layer and the bottom combined layer, the first graphene layer and the second graphene layer face each other, and the first electrode and the second electrode are vertically misaligned; and (viii) injecting liquid crystal, piezocrystal, ionic liquid, or ion gel to fill the space between the top combined layer and the bottom combined layer. The graphene-based THz device thus formed includes two graphene layers and a liquid crystal layer, a piezocrystal layer, an ionic liquid layer, or an ion gel layer disposed between the two graphene layers.

Examples of the dielectric material, first electrode, and second electrode are enumerated above.

The details of the invention are set forth in the drawing and description below. Other features, objects, and advantages of the invention will be apparent from the description and from the claims.

BRIEF DESCRIPTION OF THE DRAWINGS

The FIGURE is a schematic diagram illustrating a graphene-based THz device in accordance with the teachings of the present invention.

DETAILED DESCRIPTION

The FIGURE is a diagram that shows schematically a graphene-based THz device 100 of the this invention. The graphene-based THz device 100 includes a top graphene layer 101a, a bottom graphene layer 101b, and a middle layer 102 sandwiched between the top graphene layer 101a and the bottom graphene layer 101b. The middle layer 102 is a liquid crystal layer, a piezocrystal layer, an ionic liquid layer, or an ion gel layer. The top graphene layer 101a and the bottom graphene layer 101b each have an electrode deposited on one of its edge, i.e., a first electrode 103a and a second electrode 103b. The first electrode 103a and the second electrode 103b are vertically misaligned to prevent short circuit through the middle layer 102. Also included in the graphene-based THz device 100 are two layers of dielectric material 104a and 104b, covering the top surface of graphene layer 101a and the bottom surface of the bottom graphene layer 101b, respectively.

The graphene-based THz device 100 is a THz phase shifter, a THz mirror, or a THz beam splitter when the middle layer 102 is a liquid crystal layer or a piezocrystal layer. As a THz phase shifter, the device 100 preferably also includes two polymer layers, one being between the top graphene layer 101a and the middle layer 102, and the other being between the bottom graphene layer 101b and the middle layer 102.

On the other hand, the graphene-based THz device 100 is a THz modulator when the middle layer 102 is an ionic liquid layer or an ion gel layer.

Without further elaboration, it is believed that one skilled in the art can, based on the description herein, utilize the present invention to its fullest extent. All publications cited herein are incorporated by reference in their entirety.

The graphene-based THz device of this invention, when including a liquid crystal layer or a piezocrystal layer disposed between a top graphene layer and a bottom graphene layer, can be used as a THz phase shifter. Discussed below is a THz phase shifter having a liquid crystal layer disposed between a top graphene layer and a bottom graphene layer.

This THz phase shifter, which is fully electrically controllable, can operate under low DC voltage. For example, having a 50 μm thick liquid crystal layer, it can achieve a phase shift of 10.8 degree operated at a DC voltage of 5 V. Further, the THz phase shifter shows continuous turnability. Namely, the degree of phase shift exhibits a linear response to the DC voltage applied.

According to the Fréedericksz transition, the threshold voltage ($v_{th}$) is determined as follows:

$$v_{th} = \pi \frac{L}{d} \sqrt{\frac{k_{11}}{\varepsilon_a \varepsilon_0}},$$

wherein L is the distance between two electrodes, d is the thickness of the liquid crystal layer, $k_{11}$ is the splay elastic constant, $e_a$ is the dielectric anisotropy, and $e_0$ is the electric permittivity in free space. See S. Chandrasekhar, Liquid-Crystals, Rep. Prog. Phys. 39, 613-692 (1976).

For a THz phase shifter of this invention having a liquid crystal layer made of 5CB with a thickness of 50 μm, $k_{11}$=5.24×10$^{-12}$ N, $e_a$=11.92, $e_0$=8.85×10$^{-12}$ F/m, L=50 μm, and d=50 μm, the threshold voltage, i.e., $v_{th}$, is calculated to be 0.7 V.

The phase shift can be determined as follows:

$$\delta(v) = \frac{2\pi f d}{c} \Delta n_{eff}(v),$$

wherein f is the frequency, d is the thickness of the liquid crystal layer, c is the speed of light in vacuum, and $\Delta n_{eff}(v)$ is the change of the effective refractive index.

As the THz phase shifter of this invention has a thin liquid crystal layer, the uniformity of an electric field is assumed and the position-dependent phase shift is negligible. $\Delta n_{eff}(v)$ can be defined as follows:

$$\Delta n_{eff}(v) = (n_e - n_o)\frac{n_o}{n_e}\left[\left(1 + \frac{n_o}{n_e}\right)\left(\frac{v - v_{th}}{v_{th}}\right)\right],$$

wherein $n_o$ and $n_e$ are the ordinary and extraordinary refractive indices of the liquid crystal.

When $(v-v_{th}) \gg v_{th}$, $(v-v_{th})/v_{th} \approx v/v_{th}$, $\Delta n_{eff}(v)$ can be re-defined as follows:

$$\Delta n_{eff}(v) = (n_e - n_o)\frac{n_o}{n_e}\left[1 - \frac{2}{v}\sqrt{\frac{k_{11}}{\varepsilon_a \varepsilon_0}}\right].$$

See S. Chandrasekhar, Liquid Crystals, Cambridge University Press, 2nd edition (1993).

$\Delta n_{eff}(v)$ is a function of an applied voltage. As such, the phase shift $\delta(v)$ is also a function of an applied voltage. When different voltages are applied to the THz phase shifter having a 5CB layer with a thickness of 50 μm, it is found that, for v>0.7 V (the threshold voltage calculated above), the experimental data are in good agreement with the predicted values of $\Delta n_{eff}(v)$. The THz phase shifter of this invention thus shows a linear phase shifting in response to applied voltages.

This THz phase shifter preferably also includes two layers of polymer, each having a thickness of 100 to 2000 nm (preferably, 200-500 nm), one being between the top graphene layer and the liquid crystal layer, and the other being between the bottom graphene layer and the liquid crystal layer. The polymer can be polyimide, polysulfone, polyethersulfone, or a combination thereof. The threshold voltage of the THz phase shifter also depends on the polymer used.

Described below is an exemplary procedure for preparing a THz phase shifter of this invention.

A single graphene layer is first grown on a copper foil by chemical vapor deposition and subsequently transferred to one surface of a quartz glass layer having a thickness of 400 μm to form a top combined layer. Then, an electrode, a ribbon (10 mm×0.5 mm×40 nm) made of a combination of Cr and Au, is thermally evaporated onto one edge of the single graphene layer in a vacuum of 5×10$^{-8}$ Torr. A bottom combined layer, including another electrode, is prepared in the same manner as the top combined layer. Next, the top combined layer and the bottom combined layer are immersed in a polyimide solution for one hour, followed by retrieving them from the polyimide solution and air-drying them to obtain a polyimide-covered top combined layer and a polyimide-covered bottom combined layer. Subsequently, the top combined layer is placed on the bottom combined layer such that (1) they are separate by three spacers that all have a height of 50 μm, (2) the two graphene layers face each other, and (3) the two electrodes are vertically misaligned to prevent short circuit between these two electrodes. Finally, 5CB is injected to fill the space between the top combined layer and the bottom combined layer.

The THz phase shifter prepared in this manner includes two graphene layers and a 5CB layer disposed between the two graphene layers. It can be used where a precise control of the phase of THz waves is required, e.g., in a THz wave-based radiation-free safety inspection instrument.

A study was conducted to test the THz phase shifter thus made at 0.25, 0.5, 0.75, and 1 THz. A Teraview time domain spectroscopy spectra 3000 was used to measure phase shifting. At all four frequencies, desired degrees of shifting could be accurately tuned by adjusting the DC voltages applied. In addition, the THz phase shifter showed a low, threshold voltage (e.g. <1V). In sum, the results confirm a linear response of phase shifting to applied DC voltages and a low threshold voltage of the THz phase shifter of this invention.

The graphene-based THz device of this invention having a liquid crystal layer or a piezocrystal layer disposed between a top graphene layer and a bottom graphene layer can also be used as a THz mirror or a THz beam splitter.

The graphene-based THz device of this invention, when including an ionic liquid layer or an ion gel layer disposed between a top graphene layer and a bottom graphene layer, is a THz modulator. The THz modulator exhibits a low insertion loss. It can achieve a modulation of up to 93% when operated at a gate voltage (i.e., voltage applied between the two electrodes) of 3 V. Further, the THz modulator shows a reliable performance from 0.1 THz to 2.5 THz.

In this THz modulator, when a gate voltage is applied to establish an electrical field between the top graphene layer and the bottom graphene layer, holes are accumulated on one of the two graphene layers, while electrons are accumulated on the other. As the electrical resistance of graphene is much smaller than that of ionic liquid, the electrical field is evenly distributed on the graphene layers.

A normalized THz transmittance T, which is used to measure the performance of a modulator, is defined as follows:

$$T=(t_v/t_0)^2,$$

wherein $t_v$ is the electric field strength of a transmitted THz signal at gate voltage $V_g$, and $t_0$ is $t_v$ when $V_g=0$.

Modulations of THz signals can also be analyzed by the absorption, transmission, and reflection of the signals, which may be simulated by the transfer matrix method described below.

According to the transfer matrix method, the propagation of a light through an interface between two materials can be described by the following transfer matrix, i.e., S matrix:

$$S_{m1/m2} = \begin{bmatrix} t_{m1/m2} & r_{m1/m2} \\ r_{m2/m1} & t_{m2/m1} \end{bmatrix} = \begin{pmatrix} \frac{2n_{m1}}{n_{m1}+n_{m2}} & \frac{n_{m2}+n_{m1}}{n_{m1}+n_{m2}} \\ \frac{n_{m1}-n_{m2}}{n_{m1}+n_{m2}} & \frac{2n_{m2}}{n_{m1}+n_{m2}} \end{pmatrix},$$

wherein n is the refractive index; t and r correspond to the transmission and reflection coefficients of the electric field, respectively; subscriptions m1 and m2 stand for materials 1 and 2, respectively. As the graphene layers are assumed to be zero in thickness and have the vacuum impedance of $Z_0=376.73\Omega$, the S matrix for a structure of m1/graphene/m2 can be written as follows:

$$S_{m1/graphene/m2} = \begin{bmatrix} t_{m1/graphene/m2} & r_{m1/graphene/m2} \\ r_{m2/graphene/m1} & t_{m2/graphene/m1} \end{bmatrix}$$

-continued
$$= \begin{bmatrix} \frac{2n_{m1}}{n_{m1}+n_{m2}+Z_0\sigma_s} & \frac{n_{m2}-n_{m1}-Z_0\sigma_s}{n_{m1}+n_{m2}+Z_0\sigma_s} \\ \frac{n_{m1}-n_{m2}-Z_0\sigma_s}{n_{m1}+n_{m2}+Z_0\sigma_s} & \frac{2n_{m2}}{n_{m1}+n_{m2}+Z_0\sigma_s} \end{bmatrix},$$

wherein $s_s$ is the conductivity of graphene.

The transfer matrix can be further converted into a single M matrix:

$$M_{m1/m2} = \frac{1}{t_{m2/m1}} \begin{bmatrix} t_{m1/m2}t_{m2/m1} - r_{m1/m2}r_{m2/m1} & r_{m2/m1} \\ r_{m1/m2} & 1 \end{bmatrix}.$$

The THz modulator of this invention is a stack of quartz glass/graphene/ionic_liquid/graphene/quartz glass that has four interfaces, i.e., air/quartz, quartz/graphene/ionic_liquid, ionic_liquid/graphene/quartz, and quartz/air.

Modulations (absorption, transmission, and reflection) of a THz wave transmitting through the THz modulator can be summarized as follows:

$$M = M_{air/quartz} \times M_{quartz/graphene/ionic\_liquid} \times M_{ionic\_liquid/graphene/quartz} \times M_{quartz/air}$$

When this M matrix is converted back to the S matrix, reflection $R=r^2$, transmission $T=t^2$, and absorption $A=1-R-T$ can be obtained. Modulations by a THz modulator of this invention are thus analyzed.

As a gate voltage changes the conductivity of the graphene layers in the THz modulator, the absorption, transmission, and reflection are modulated accordingly.

Described below is an exemplary procedure for preparing a THz modulator of this invention.

A single graphene layer is first grown on a copper foil by chemical vapor deposition and subsequently transferred to one surface of a quartz glass layer having a thickness of 400 µm to form a top combined layer. Then, an electrode, a ribbon (10 mm×0.5 mm×40 nm) made of a combination of Cr and Au, is thermally evaporated onto one edge of the single graphene layer in a vacuum of $5\times10^{-8}$ Torr. Next, a bottom combined layer, including another electrode, is prepared in the same mariner as the top combined layer. Subsequently, the top combined layer is placed on the bottom combined layer such that (1) the two combined layers are separate by three spacers that have a height of 100 µm, (2) the two graphene layers face each other, and (3) the two electrodes are vertically misaligned to prevent short circuit between these two electrodes. Finally, [EMIM][TFSI] is injected to fill the space between the top combined layer and the bottom combined layer.

The THz modulator prepared in this manner includes two graphene layers and an [EMIM][TFSI] layer disposed between the two graphene layers. It can be used in applications THz modulator such as THz spectroscopy, THz safety surveillance, THz cancer diagnosis, THz imaging, THz semiconductor quality control, and THz communication.

A study was conducted in which the THz modulator thus made was tested for modulating THz signals. Normalized THz transmittances ($T=(t_v/t_0)^2$ as defined above) were averaged across the entire testing bandwidth from 0.1 THz to 2.5 THz. It was found that the averaged normalized THz transmittance decreased with an increasing gate voltage applied. The THz modulator exhibited an electric field modultion as high as 93% when a single THz modulator was used, and as high as 99% when two THz modulators were stacked, both at a gate voltage of 3 V. In another study, test data on modulated THz signals were compared with simulated absorption, transmission, and reflection values obtained following the transfer matrix method. The simulated values overall agreed well with the test data.

OTHER EMBODIMENTS

All of the features disclosed in this specification may be combined in any combination. Each feature disclosed in this specification may be replaced by an alternative feature serving the same, equivalent, or similar purpose. Thus, unless expressly stated otherwise, each feature disclosed is only an example of a generic series of equivalent or similar features.

Further, from the above description, one skilled in the art can easily ascertain the essential characteristics of the present invention, and without departing from the spirit and scope thereof, can make various changes and modifications of the invention to adapt it to various usages and conditions. Thus, other embodiments are also within the claims.

What is claimed is:

1. A graphene-based terahertz device comprising:
a top graphene layer that is formed of 1 to 10 graphenes and has a first electrode deposited on one edge of the layer;
a bottom graphene layer that is formed of 1 to 10 graphenes and has a second electrode deposited on one edge of the layer; and
a liquid crystal layer or a piezocrystal layer, 1 to 1000 µm in thickness, disposed between the top graphene layer and the bottom graphene layer,
wherein the first electrode and the second electrode are so aligned to prevent short circuit through the liquid crystal layer or the piezocrystal layer, and the top surface of the top graphene layer and the bottom surface of the bottom graphene layer are each covered by a layer of dielectric material.

2. The graphene-based terahertz device of claim 1, wherein a liquid crystal layer is disposed between the top graphene layer and the bottom graphene layer.

3. The graphene-based terahertz device of claim 2, further comprising two layers of polymer having a thickness of 100 to 2000 nm, wherein one of the two layers is between the top graphene layer and the liquid crystal layer, the other layer is between the bottom graphene layer and the liquid crystal layer, and the polymer is polyimide, polysulfone, polyethersulfone, or a combination thereof.

4. The graphene-based terahertz device of claim 3, wherein the first electrode and the second electrode are, independently, made of Ti, Au, Cr, Cu, or a combination thereof.

5. The graphene-based terahertz device of claim 3, wherein the dielectric material is glass, silicon, magnesia, sapphire, or polymer.

6. The graphene-based terahertz device of claim 4, wherein the first electrode and the second electrode are both made of a combination of Cr and Au.

7. The graphene-based terahertz device of claim 5, wherein the dielectric material is glass.

8. The graphene-based terahertz device of claim 3, wherein the liquid crystal layer is made of 4'-n-pentyl-4-cyanobiphenyl.

9. The graphene-based terahertz device of claim 8, wherein the polymer is a polyimide, the first electrode and the second electrode are both made of a combination of Cr and Au, and the dielectric material is glass.

10. A graphene-based terahertz device comprising:
a top graphene layer that is formed of 1 to 10 graphenes, and has a first electrode deposited on one edge of the layer;
a bottom graphene layer that is formed of 1 to 10 graphenes and has a second electrode deposited on one edge of the layer; and
an ionic liquid layer or an ion gel layer, 1 to 1000 µm in thickness, disposed between the top graphene layer and the bottom graphene layer,
wherein the first electrode and the second electrode are so aligned to prevent short circuit through the ionic liquid or ion gel layer, and the top surface of the top graphene layer and the bottom surface of the bottom graphene layer are each covered by a layer of dielectric material.

11. The graphene-based terahertz device of claim 10, wherein an ionic liquid layer is disposed between the top graphene layer and the bottom graphene layer.

12. The terahertz device of claim 11, wherein the first electrode and the second electrode are, independently, made of Ti, Au, Cr, Cu, or a combination thereof.

13. The terahertz device of claim 11, wherein the dielectric material is glass, silicon, magnesia, sapphire, or polymer.

14. The graphene-based terahertz device of claim 12, wherein the first electrode and the second electrode are both made of a combination of Cr and Au.

15. The graphene-based terahertz device of claim 13, wherein the dielectric material is glass.

16. The graphene-based terahertz device of claim 11, wherein the ionic liquid layer is made of 1-ethyl-3-methylimidazolium bis(tri-fluoromethylsulfonyl) imide.

17. The graphene-based terahertz device of claim 16, wherein the first electrode and the second electrode are both made of a combination of Cr and Au and the dielectric material is glass.

18. A method of preparing a graphene-based terahertz device, comprising:
providing a first layer of dielectric material;
providing a first graphene layer that is formed of 1 to 10 graphenes on one surface of the first layer of dielectric material to form a top combined layer;
depositing a first electrode on one edge of the first graphene layer;
providing a second layer of dielectric material;
providing a second graphene layer that is formed of 1 to 10 graphenes on one surface of the second layer of dielectric material to form a bottom combined layer;
depositing a second electrode on one edge of the second graphene layer;
immersing the top combined layer and the bottom combined layer in a solution of polymer to obtain a polymer-covered top combined layer and a polymer-covered bottom combined layer;
retrieving the polymer-covered top combined layer and the polymer-covered bottom combined layer from the solution of polymer and air-drying them;
placing the polymer-covered top combined layer on the polymer-covered bottom combined layer such that they are separate by one or more spacers that have a height of 1 to 1000 µm leaving a space between the polymer-covered top combined layer and the polymer-covered bottom combined layer, the first graphene layer and the second graphene layer face each other, and the first electrode and the second electrode are so aligned to prevent short circuit between these two electrodes; and injecting liquid crystal or piezocrystal to fill the space between the polymer-covered top combined layer and the polymer-covered bottom combined layer, whereby the terahertz device is obtained.

19. The method of claim 18, wherein the injecting step is performed by injecting liquid crystal to fill the space between the top combined layer and the bottom combined layer.

20. The method of claim 19, wherein the first graphene layer and second graphene layer are grown by chemical vapor deposition.

21. The method of claim 20, wherein the polymer is polyimide, polysulfone, polyethersulfone, or a combination thereof; the first electrode and the second electrode are, independently, made of Ti, Au, Cr, Cu, or a combination thereof; and the dielectric material is glass, silicon, magnesia, sapphire, or polymer.

22. The method of claim 21, wherein the polymer is a polyimide, the first electrode and the second electrode are both made of a combination of Cr and Au, the dielectric material is glass, and the liquid crystal is 4'-n-pentyl-4-cyanobiphenyl.

23. A method of preparing a graphene-based terahertz device, comprising:
   providing a first layer of dielectric material;
   providing a first graphene layer that is formed of 1 to 10 graphenes on one surface of the first layer of dielectric material to form a top combined layer;
   depositing a first electrode on one edge of the first graphene layer;
   providing a second layer of dielectric material;
   providing a second graphene layer that is formed of 1 to 10 graphenes on one surface of the second layer of dielectric material to form a bottom combined layer;
   depositing a second electrode on one edge of the second graphene layer;
   placing the top combined layer on the bottom combined layer such that they are separate by one or more spacers that have a height of 1 to 1000 µm leaving a space between the top combined layer and the bottom combined layer, the first graphene layer and the second graphene layer face each other, and the first electrode and the second electrode are so aligned to prevent short circuit between these two electrodes; and
   injecting ionic liquid or ion gel to fill the space between the top combined layer and the bottom combined layer, whereby the terahertz device is obtained.

24. The method of claim 23, wherein the injecting step is performed by injecting ionic liquid to fill the space between the top combined layer and the bottom combined layer.

25. The method of claim 24, wherein the first graphene layer and second graphene layer are grown by chemical vapor deposition.

26. The method of claim 25, wherein the first electrode and the second electrode are, independently, made of Ti, Au, Cr, Cu, or a combination thereof, and the dielectric material is glass, silicon, magnesia, sapphire, or polymer.

27. The method of claim 26, wherein the first electrode and the second electrode are both made of a combination of Cr and Au, the dielectric material is glass, and the ionic liquid is 1-ethyl-3-methylimidazolium bis(tri-fluoromethylsulfonyl) imide.

* * * * *